United States Patent [19]
Keller et al.

[11] Patent Number: 5,985,719
[45] Date of Patent: *Nov. 16, 1999

[54] METHOD OF FORMING A PROGRAMMABLE NON-VOLATILE MEMORY CELL

[75] Inventors: J. Dennis Keller; Roger R. Lee, both of Boise, Id.

[73] Assignee: Micron Technology, Inc., Boise, Id.

[ * ] Notice: This patent is subject to a terminal disclaimer.

[21] Appl. No.: 08/977,313

[22] Filed: Nov. 24, 1997

Related U.S. Application Data

[63] Continuation of application No. 08/627,778, Apr. 1, 1996, Pat. No. 5,707,898.

[51] Int. Cl.$^6$ .............................................. H01L 21/8247
[52] U.S. Cl. .......................................... 438/265; 438/595
[58] Field of Search ................................ 438/261, 265, 438/591, 593, 594, 595, 762, 763

[56] References Cited

U.S. PATENT DOCUMENTS

| | | | |
|---|---|---|---|
| 5,068,697 | 11/1991 | Noda et al. ............................... | 257/324 |
| 5,298,446 | 3/1994 | Onishi et al. .............................. | 437/44 |
| 5,422,504 | 6/1995 | Chang et al. ............................ | 257/316 |
| 5,460,992 | 10/1995 | Hasegawa .................................. | 437/43 |
| 5,472,890 | 12/1995 | Oda ........................................... | 437/44 |
| 5,534,456 | 7/1996 | Yuan et al. ................................. | 437/43 |
| 5,573,965 | 11/1996 | Chen et al. ............................... | 438/595 |
| 5,614,748 | 3/1997 | Nakajima et al. ....................... | 257/316 |

FOREIGN PATENT DOCUMENTS

| | | | |
|---|---|---|---|
| 57-130474 | 8/1982 | Japan ..................................... | 257/316 |

OTHER PUBLICATIONS

Wolf, "Silicon Processing for the VLSI Era", vol. 1, p. 195, 1986.

*Primary Examiner*—Chandra Chaudhari
*Attorney, Agent, or Firm*—Wells, St. John, Roberts, Gregory & Matkins P.S.

[57] ABSTRACT

A method of reducing undesired electron depletion through sidewalls of a floating gate of a floating gate transistor comprising providing a non-oxide or oxynitride layer over said sidewalls. Integrated circuitry including a non-volatile field effect transistor includes, a) a floating gate transistor having a gate construction and a pair of opposing source/drain regions, the gate construction having at least one sidewall; b) a shielding layer over the gate sidewall; and c) a dielectric layer on the shielding layer, the dielectric layer being of a different material than the shielding layer. The shielding layer might be provided over an oxide layer previously provided on sidewalls of the gate construction. The shielding layer might be provided over sidewall spacers previously provided relative to sidewalls of the gate construction. Example and preferred shielding layer materials include $Si_3N_4$, oxynitride compounds, and aluminum.

4 Claims, 4 Drawing Sheets

METHOD OF FORMING A PROGRAMMABLE NON-VOLATILE MEMORY CELL

RELATED PATENT DATA

This is a continuation application which claims priority from application Ser. No. 08/627,778, now U.S. Pat. No. 5,707,898 and which was filed on Apr. 1, 1996.

TECHNICAL FIELD

This invention relates generally to fabrication of semiconductor wafers to form memory arrays having non-volatile memory devices employing floating gate transistors.

BACKGROUND OF THE INVENTION

Typical semiconductor memory utilized during microprocessor operation is volatile. That is in the case of power interruption, the data stored in the semiconductor memory is typically completely lost. One way to circumvent this problem is to provide separate backup of the memory, such as battery power or capacitor storage. An alternate technique is to make the memory fundamentally non-volatile. This option is highly desirable because non-volatile semiconductor memories would not only withstand power interruption, but also would be stored or shipped without being energized.

Random access memories (RAMs) enable information to be both stored and read to a memory cell as dictated by a microprocessor. Read-only-memories (ROMs), on the other hand, are memories into which information is permanently stored during fabrication and cannot be subsequently written to by a microprocessor. All ROM memory is considered non-volatile as only read operations can be performed.

Each bit of information in a ROM is stored by the presence or absence of a data path from the word (access) line to a bit (sense) line. The data path is eliminated simply by insuring no circuit element joins a word and bit line. Thus, when the word line of a ROM is activated, the presence of a signal on the bit line will mean that a 1 is stored, whereas the absence of a signal indicates that a 0 is stored.

If only a small number of ROM circuits are needed for a specific application, custom mask fabrication might be too expensive or time consuming. In such cases, it would be faster and cheaper for users to program each ROM chip individually. ROMs with such capabilities are referred to as programmable read-only-memories (PROMs). In the first PROMs which were developed, information could only be programmed once into the construction and then could not be erased. In such PROMs, a data path exists between every word and bit line at the completion of the chip manufacture. This corresponds to a stored 1 in every data position. Storage cells during fabrication were selectively altered to store a 0 following manufacture by electrically severing the word-to-bit connection paths. Since the write operation was destructive, once the 0 had been programmed into a bit location it could not be erased back to a 1. PROMs were initially implemented in bipolar technology, although MOS PROMs became available.

Later work with PROMs led to development of erasable PROMs. Erasable PROMs depend on the long-term retention of electric charge as the means for information storage. Such charge is stored on a MOS device referred to as a floating polysilicon gate. Such a construction differs slightly from a conventional MOS transistor gate. The conventional MOS transistor gate of a memory cell employs a continuous polysilicon word line connected among several MOS transistors which functions as the respective transistor gates. The floating polysilicon gate of an erasable PROM interposes a localized secondary polysilicon gate in between the continuous word line and silicon substrate into which the active areas of the MOS transistors are formed. The floating gate is localized in that the floating gates for respective MOS transistors are electrically isolated from the floating gates of other MOS transistors.

Various mechanisms have been implemented to transfer and remove charge from a floating gate. One type of erasable programmable memory is the so-called electrically programmable ROM (EPROM). The charge-transfer mechanism occurs by the injection of electrons into the floating polysilicon gate of selected transistors. If a sufficiently high reverse-bias voltage is applied to the transistor drain being programmed, the drain-substrate "pn" junction will experience "avalanche" breakdown, causing hot electrons to be generated. Some of these will have enough energy to pass over the insulating oxide material surrounding each floating gate and thereby charge the floating gate. These EPROM devices are thus called floating-gate, avalanche-injection MOS transistors (FAMOS). Once these electrons are transferred to the floating gate, they are trapped there. The potential-barrier at the oxide-silicon interface of the gate is greater than 3 eV, making the rate of spontaneous emission of the electrons from the oxide over the barrier negligibly small. Accordingly, the electronic charge stored on the floating gate can be retained for many years.

When the floating gate is charged with a sufficient number of electrons, inversion of the channel under the gate occurs. A continuously conducting channel is thereby formed between the source and drain exactly as if an external gate voltage had been applied. The presence of a 1 or 0 in each bit location is therefore determined by the presence or absence of a conducting floating channel gate in each device.

Such a construction also enables means for removing the stored electrons from the floating gate, thereby making the PROM erasable. This is accomplished by flood exposure of the EPROM with strong ultraviolet light for approximately 20 minutes. The ultraviolet light creates electron-hole pairs in the silicon dioxide, providing a discharge path for the charge (electrons) from the floating gates.

In some applications, it is desirable to erase the contents of a ROM electrically, rather than to use an ultraviolet light source. In other circumstances, it would be desirable to be able to change one bit at a time, without having to erase the entire integrated circuit. Such led to the development of electrically erasable PROMs (EEPROMs). Such technologies include NMOS transistors, floating-gate tunnel oxide MOS transistors (FLOTOX), textured high-polysilicon floating-gate MOS transistors, and flash EEPROMs. Such technologies can include a combination of floating gate transistor memory cells within an array of such cells, and a peripheral area to the array which comprises CMOS transistors.

With floating gate transistors, the floating gate polysilicon (commonly referred to as Poly 1) is positioned in between the overlying word line polysilicon (commonly referred to as Poly 2) and underlying substrate. FIG. 1 illustrates an exemplary prior art floating gate transistor construction as utilized in an array of memory cells employing non-volatile floating gate transistors. A wafer fragment 10 comprises a bulk monocrystalline silicon substrate 12 having filed oxide regions 14 provided therein. A floating gate transistor is indicated generally with numeral 15, and comprises a gate construction 16 and a pair of opposing source/drain regions 18. Gate construction 16 comprises a gate oxide or tunneling oxide layer 19, a floating gate layer 20 (typically conductively doped polysilicon), an overlying dielectric layer 21, and a wordline or control gate 22 thereatop. Gate construction 16 includes a pair of outer sidewalls 23 having an oxide layer 24 grown thermally thereover. A planarized dielectric layer 25 (typically borophosphosilicate glass or undoped $SiO_2$ deposited by decomposition to tetraethylorthosilicate [TEOS]) is provided outwardly over gate construction 16.

Conductive regions 20 and 22 act as two plates of a capacitor. Programming of the device occurs as described above by ingesting floating gate layer 20 with a large volume of electrons. The overlying gate line 22 is thereby prevented from gating the underlying substrate channel region between source/drain diffusion regions 18. The transistor in such state is considered to be "programmed", effectively in a "zero" or "off" state.

FIG. 2 illustrates an analogous prior art construction. Like numerals from the first described embodiment are utilized where appropriate, with differences being indicated by the suffix "a" or by different numerals. Transistor gate construction 16a within a wafer fragment 10a includes anisotropically etched sidewall spacers 26, typically comprising undoped $SiO_2$ deposited by decomposition of tetraethylorthosilicate (TEOS). Source/drain regions 18a further comprise LDD regions 19. Such circuitry, at least with respect to memory integrated circuitry, would typically be utilized in control circuitry peripheral to the memory array circuitry. The FIG. 1 prior art is generally utilized within a memory array where LDD regions are not typically utilized.

One challenge in maintaining a programmed transistor in either of the above described and depicted embodiments is assuring that the electrons programmed into the floating gate layer 20 do not deplete or migrate from the floating gate. One principal pathway for such undesired migration is laterally outward of sidewalls 23. If sufficient electrons laterally migrate outward of floating gate layer 20, the transistor effectively becomes undesirably deprogrammed. The problem can be especially problematic in memory integrated circuitry having two closely adjacent gate constructions 16 having different respective programmed states. Electrons from the programmed floating gate transistor are attracted towards the floating gate of a non-programmed transistor, which adversely adds to the electron migration problem.

Further, gate construction 16 is susceptible to undesired minority carrier and other contaminate ingestion. Specifically, minority carrier "holes" emanating from other areas of operating circuitry have a tendency to migrate through insulating layer 25, through oxide layers 25 and 24 into conductive gate regions 20 and 22. Impurities likewise can physically diffuse within such regions.

It would be desirable to overcome or alleviate the above described prior art problems.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of reducing undesired electron depletion through sidewalls of a floating gate of a floating gate transistor comprises providing a non-oxide layer over said sidewalls.

In accordance with another aspect of the invention, integrated circuitry including a non-volatile field effect transistor comprises:

a floating gate transistor having a gate construction and a pair of opposing source/drain regions, the gate construction having at least one sidewall;

a shielding layer over the gate sidewall; and a dielectric layer on the shielding layer, the dielectric layer being of a different material than the shielding layer.

Figure 1:
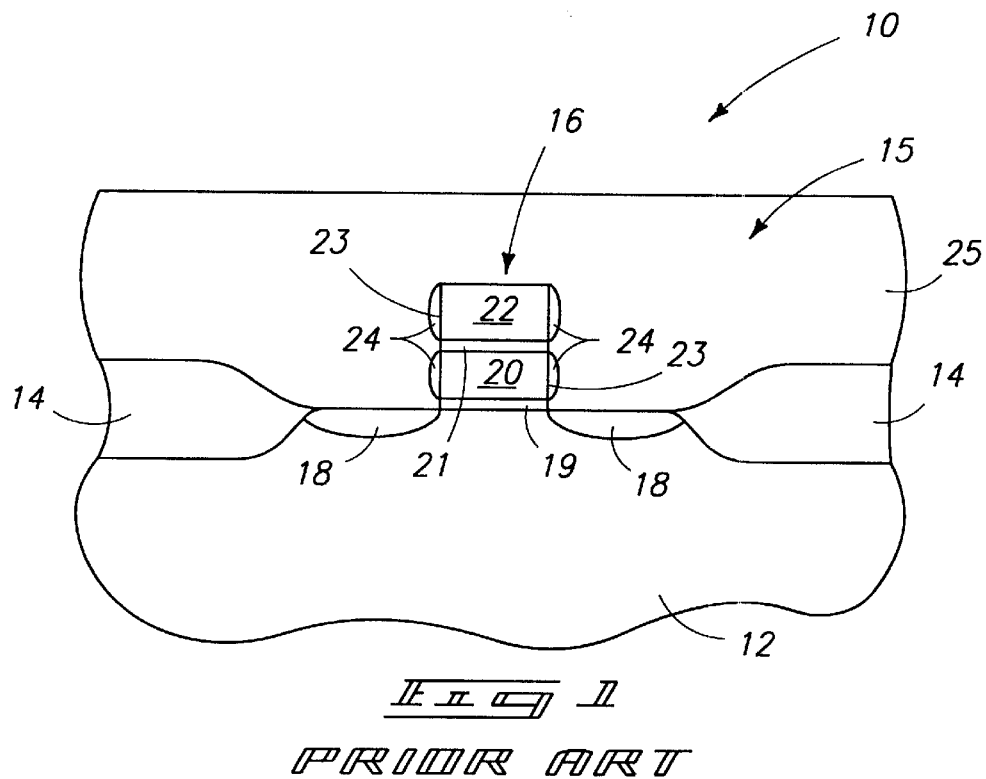
FIG. 1 is diagrammatic sectional view of a prior art semiconductor wafer fragment, and is discussed in the "Background" section above.
Figure 2:
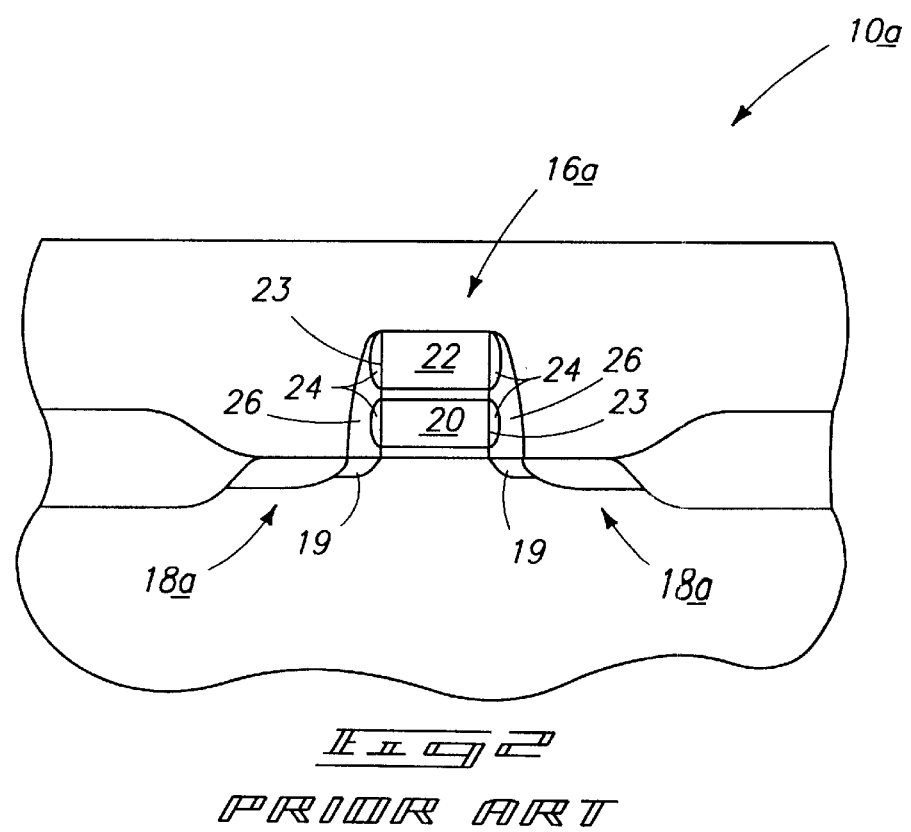
FIG. 2 is diagrammatic sectional view of another prior art semiconductor wafer fragment, and is discussed in the "Background" section above.
Figure 3:
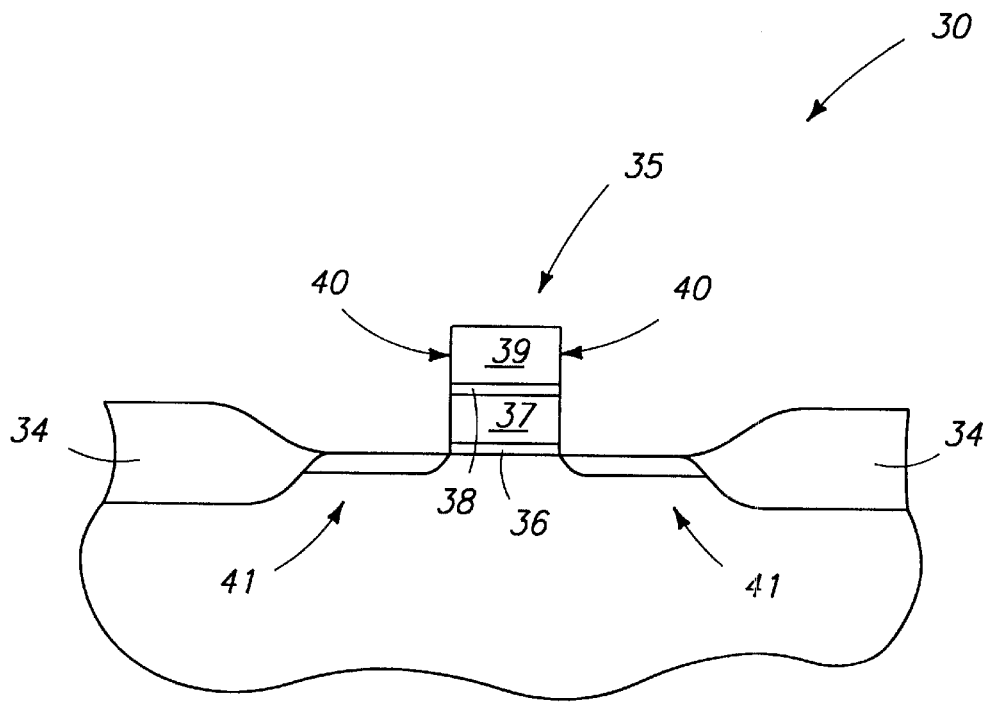
FIG. 3 is diagrammatic sectional view of a semiconductor wafer fragment at one step in accordance with the invention.

Preferred aspects of the invention are initially described with reference to FIGS. 3 and 4 where a wafer fragment is generally indicated with reference numeral 30. Such comprises a bulk monocrystalline silicon substrate 32 having field oxide regions 34 provided therein. A patterned gate construction 35 includes conventional prior art tunneling or other gate dielectric layer 36, an overlying floating gate layer 37, an overlying dielectric layer 38, and an outer control or wordline gate 39. Gate construction 35 includes a pair of opposing sidewalls 40. A pair of opposing source/drain regions 41 are provided relative to bulk substrate 32. Typically and preferably, bulk substrate 32 would be provided with a suitable low background p-doping concentration, with source/drain diffusion regions 14 constituting heavily doped n-type material.

Figure 4:
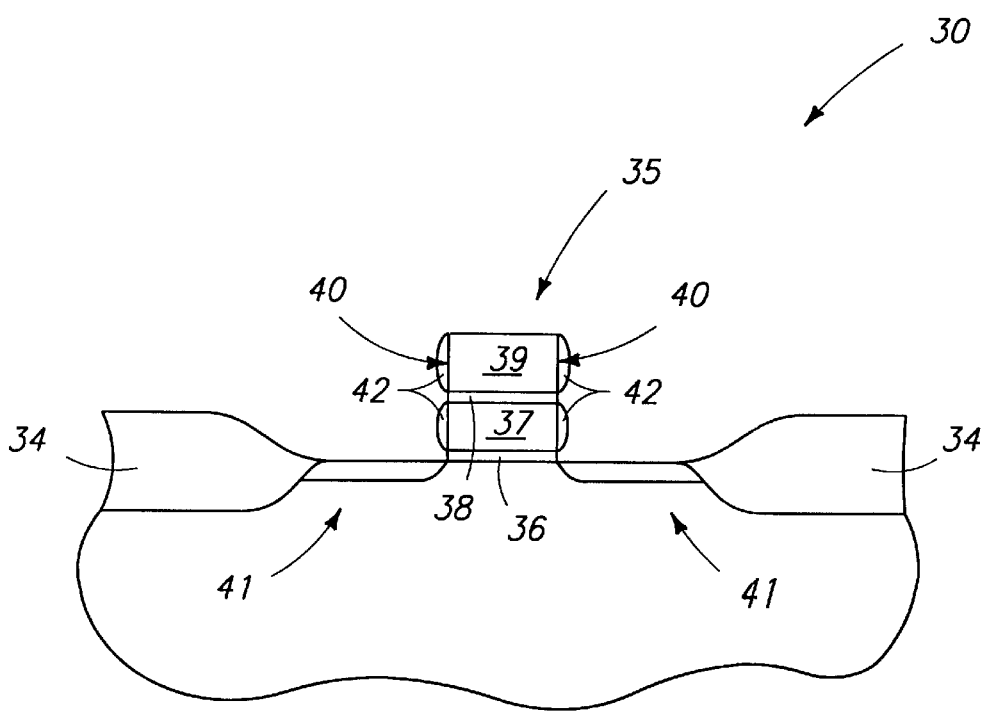
FIG. 4 is a view of the FIG. 3 wafer fragment at a processing step subsequent to that shown by FIG. 2.

Referring to FIG. 4, an oxide layer 42 is provided on gate sidewalls 40. Such is preferably provided by a thermal growing technique, with such not being shown grown over the exposed silicon areas of the substrate for clarity.

Figure 5:
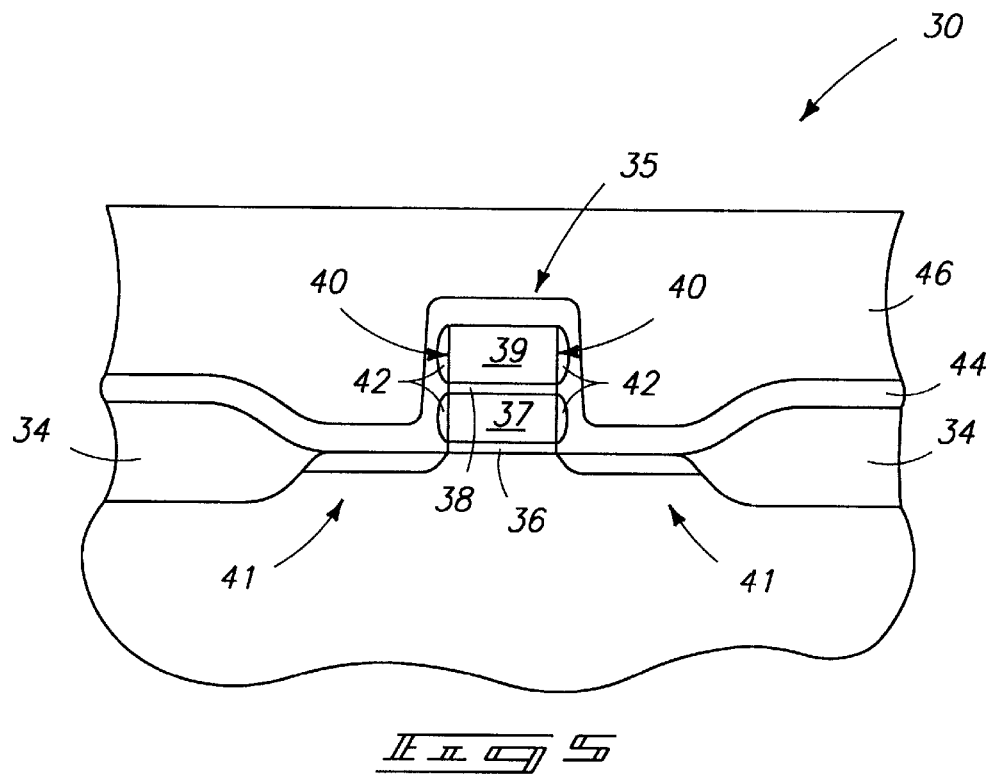
FIG. 5 is a view of the FIG. 3 wafer fragment at a processing step subsequent to that shown by FIG. 4.

Referring to FIG. 5, a shielding layer 44 is provided directly on oxide layer 42, and thus over gate sidewalls 40. Such preferably comprises an oxynitride compound ($SiO_xN_y$) or a non-oxide layer. Oxynitride compounds are characterized by having material properties which are a compromise between those of pure nitride and pure oxide with respect to the stopping or barrier characteristics capability of nitride for moisture and sodium and the stress relief qualities of oxide. Such can be deposited by conventional techniques, such as LPCVD, PECVD, etc. Other preferred examples for shielding layer 42 include aluminum and $Si_3N_4$, with $Si_3N_4$ believed to be most preferred material for the shielding layer. Layer 44 is preferably provided to a thickness of about 50 Angstroms to about 200 Angstroms, with from about 100 Angstroms to about 150 Angstroms being most preferred.

A dielectric layer 46 is provided over shielding layer 44, and preferably planarized as shown. Most preferably and as shown, dielectric layer 46 is preferably provided directly on shielding layer 44. Ideally, the dielectric layer is of a different predominate material than the shielding layer. Example and preferred materials for layer 46 include BPSG or undoped $SiO_2$.

Layer 44 effectively functions as a shielding or diffusion restricting layer to both undesired electron depletion through sidewalls of the floating gate, and as well to minority character or other impurity diffusion into gate construction 35.

Figure 6:
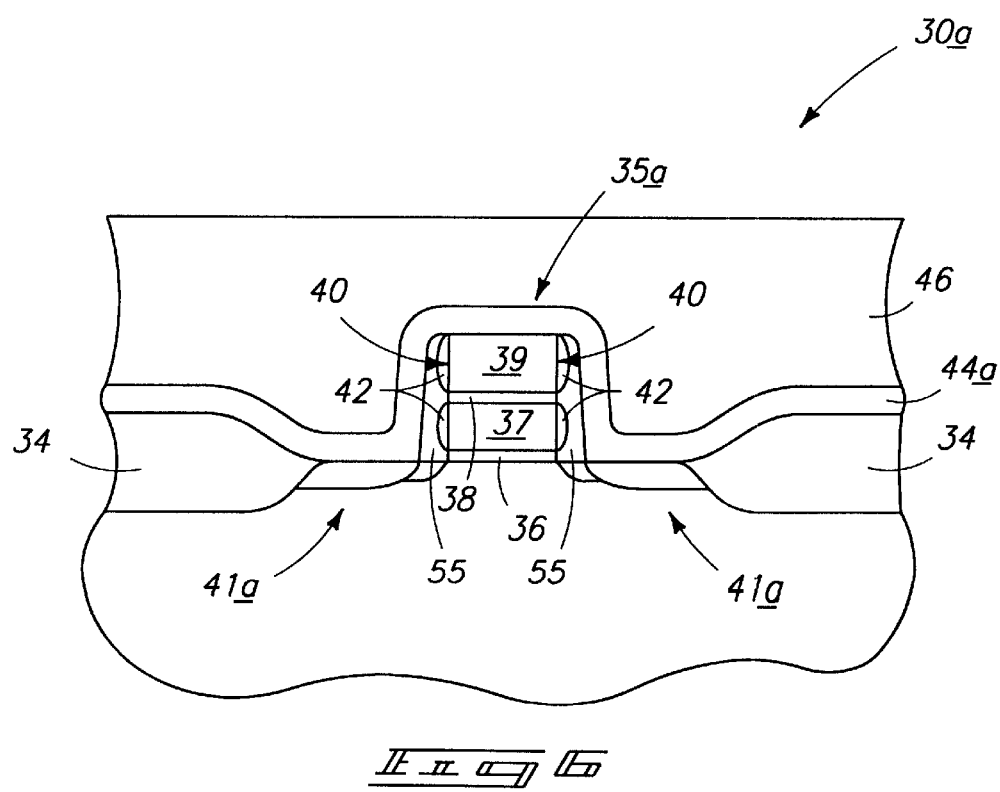
FIG. 6 is diagrammatic sectional view of an alternate embodiment semiconductor wafer fragment in accordance with the invention.

One alternate embodiment is shown in FIG. 6. Like numerals from the first described embodiment are utilized where appropriate, with differences being indicated by the suffix "a" or with different numerals. Floating gate construction 35a in a wafer fragment 30a differs from the first described embodiment in the provision of anisotropically etched electrically insulating sidewall spacers 55 being provided directly on oxide layer 42, with shielding layer 44a being deposited over, and directly on as shown, spacers 55.

Figure 7:
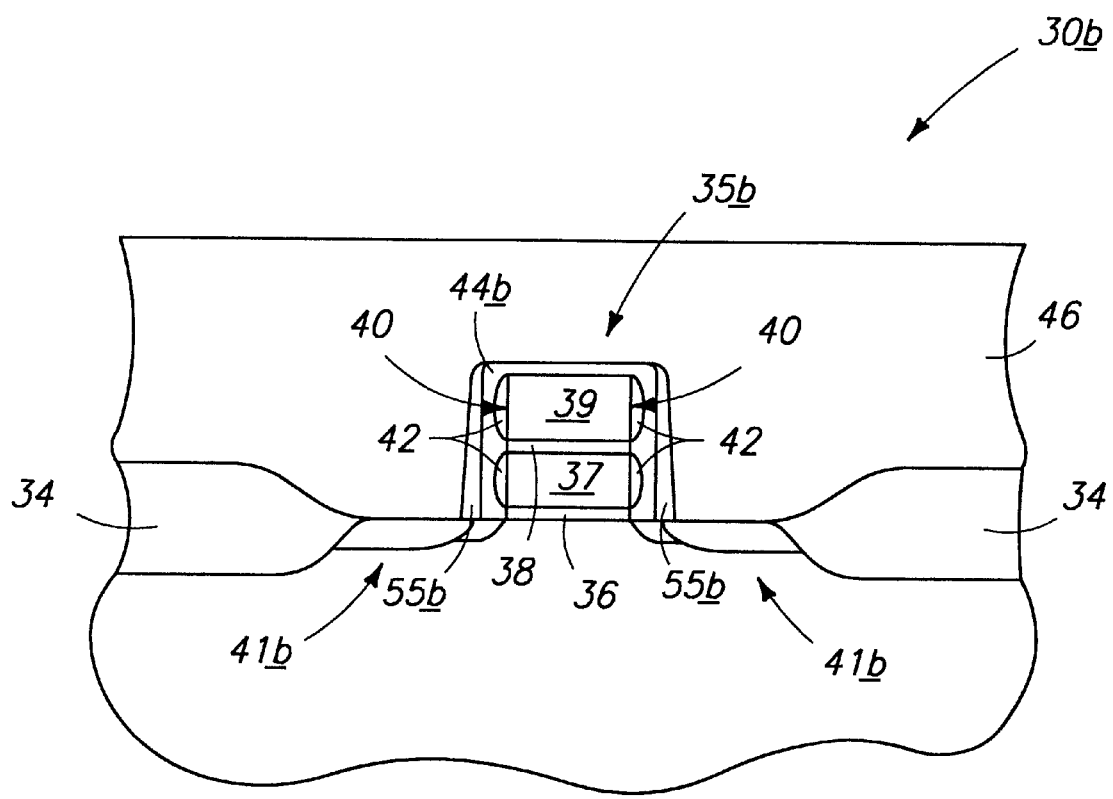
FIG. 7 is diagrammatic sectional view of another alternate embodiment semiconductor wafer fragment in accordance with the invention.

A further alternate embodiment is shown and described with reference to FIG. 7. Like numerals from the first described embodiment are utilized where appropriate, with differences being indicated by the suffix "b", or with different numerals. The FIG. 7 construction is similar to the FIG. 6 construction. However here, a gate construction 35b within a wafer fragment 30b provides shielding layer 44b prior to provision of anisotropically etched spacers 55b. Shielding layer 44b is provided over, and preferably directly on as shown, oxide layer 42. A spacer layer would then be deposited and anisotropically etched to produce spacers 55b.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a floating gate transistor, comprising:

forming a floating gate construction having opposing lateral sidewalls;

providing opposing source and drain regions operably adjacent the floating gate construction;

forming an oxide layer over the gate sidewalls;

forming a non-oxide layer over the oxide layer;

forming sidewall spacers over the non-oxide layer and outwardly of the sidewalls; and forming a dielectric layer over the sidewall spacers, the dielectric layer being of a different material than the non-oxide layer.

2. A method of forming a floating gate transistor, comprising:

forming a floating gate construction having opposing lateral sidewalls;

providing opposing source and drain regions operably adjacent the floating gate construction;

forming an oxide layer over the gate sidewalls;

forming an aluminum shielding layer over the oxide layer;

forming a sidewall spacer outwardly of the aluminum shielding layer; and forming a dielectric layer over the sidewall spacer.

3. A method of forming a floating gate transistor, comprising:

forming a floating gate construction having opposing lateral sidewalls;

providing opposing source and drain regions operably adjacent the floating gate construction;

forming an oxide layer over the gate sidewalls;

forming a shielding layer of $Si_3N_4$ over the oxide layer;

forming a sidewall spacer outwardly of the shielding layer of $Si_3N_4$; and forming a dielectric layer over the sidewall spacer, the dielectric layer being of a different material than the shielding layer of $Si_3N_4$.

4. A method of forming a floating gate transistor, comprising:

forming a floating gate construction having opposing lateral sidewalls;

providing opposing source and drain regions operably adjacent the floating gate construction;

forming an oxide layer over the gate sidewalls;

forming a non-oxide layer over the oxide layer;

forming sidewall spacers outwardly of the non-oxide layer; and forming a layer over the sidewall spacers, the layer selected from the group comprising BPSG and $SiO_2$, and wherein the layer over the sidewall spacers and non-oxide layer are of different materials.

* * * * *